United States Patent [19]
Ketelhohn

[11] Patent Number: 5,002,616
[45] Date of Patent: Mar. 26, 1991

[54] PROCESS AND APPARATUS FOR FLIUD TREATMENT OF ARTICLES

[75] Inventor: Karl F. G. Ketelhohn, State College, Pa.

[73] Assignee: Chemcut Corporation, State College, Pa.

[21] Appl. No.: 399,706

[22] Filed: Aug. 28, 1989

[51] Int. Cl.$^5$ .............................. B08B 9/20; B08B 3/00
[52] U.S. Cl. ..................................... 134/25.1; 134/25.4; 134/32; 134/34; 134/37; 134/130; 134/131
[58] Field of Search .................. 134/25.1, 25.2, 32, 134/34, 36, 131, 130, 25.4, 37

[56] References Cited

U.S. PATENT DOCUMENTS

| | | | |
|---|---|---|---|
| 2,701,049 | 2/1955 | Kendall et al. | 198/127 |
| 3,082,774 | 3/1963 | Benton et al. | 134/63 |
| 3,448,720 | 6/1969 | Graham | 118/110 |
| 3,776,800 | 12/1973 | Goffredo et al. | 156/345 |
| 3,801,387 | 4/1974 | Goffredo et al. | 134/198 |
| 3,905,827 | 9/1975 | Goffredo et al. | 134/13 |
| 4,017,982 | 4/1977 | Goffredo | 34/31 |
| 4,233,106 | 11/1980 | Goffredo | 156/627 |
| 4,361,967 | 12/1982 | Bahnsen et al. | 34/151 |
| 4,425,869 | 1/1984 | Hull | 118/314 |
| 4,576,685 | 3/1986 | Goffredo et al. | 204/45 |
| 4,607,590 | 8/1986 | Pender | 118/314 |
| 4,620,894 | 11/1986 | Gurian et al. | 156/345 |
| 4,662,976 | 5/1987 | Höllmüller | 156/345 |
| 4,781,205 | 11/1988 | Shakley | 134/131 |

Primary Examiner—Curtis R. Davis
Attorney, Agent, or Firm—Paul & Paul

[57] ABSTRACT

A method and apparatus is provided for fluid treatment of articles, while the articles are being delivered along a path through a preferably substantially closed chamber. During treatment, the articles are conveyed by rotating disk-like members that establish their path, with the disks being mounted on shaft-like rods for movement therewith. The treatment can comprise spraying or flooding the articles with a liquid or a gas, or may comprise drawing of air or other gases from the vicinity of the articles, or even drawing of liquid from the vicinity of the articles, if desired. Whatever the fluid treatment, it is provided by means of individual nozzles that are mounted between disk-like members on the rods, and which are there adapted for movement with the rods.

In one embodiment, the nozzles may be mounted opposed each other, with openings for fluid generally opposed each other, above and below a generally horizontal path of travel such that articles pass between the nozzles. In instances in which the articles being treated are printed circuit boards, fluid may either be drawn through through-holes in printed circuit boards, or fluid may be applied to the boards, depending upon the direction of fluid flow.

32 Claims, 2 Drawing Sheets

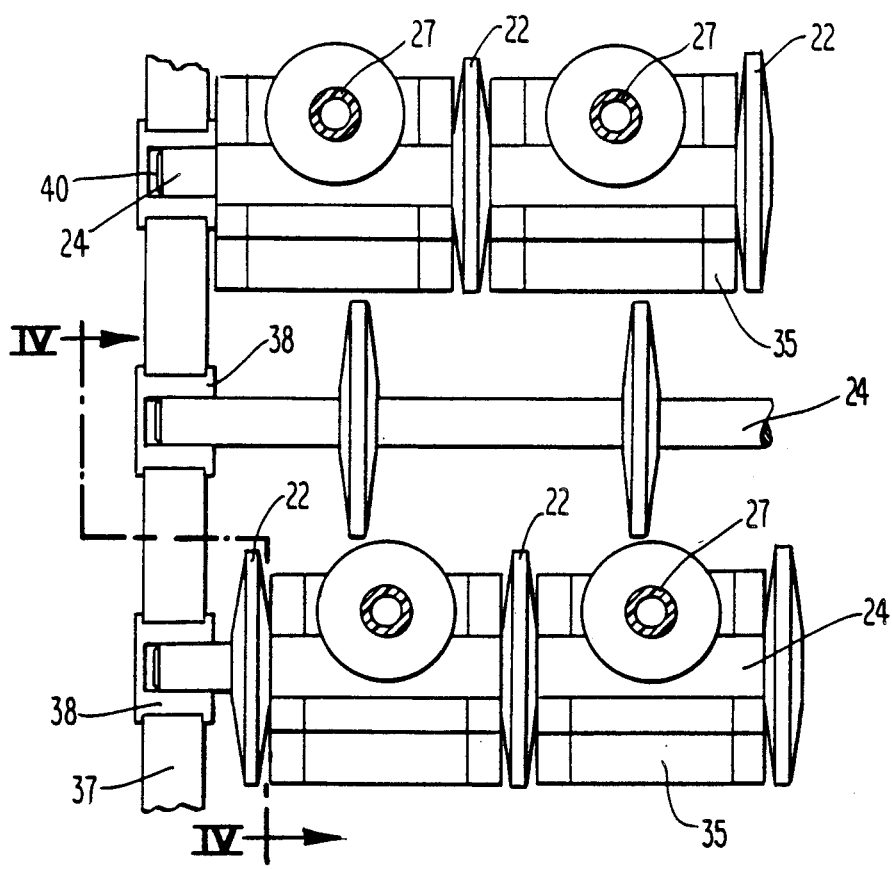
Fig. 3
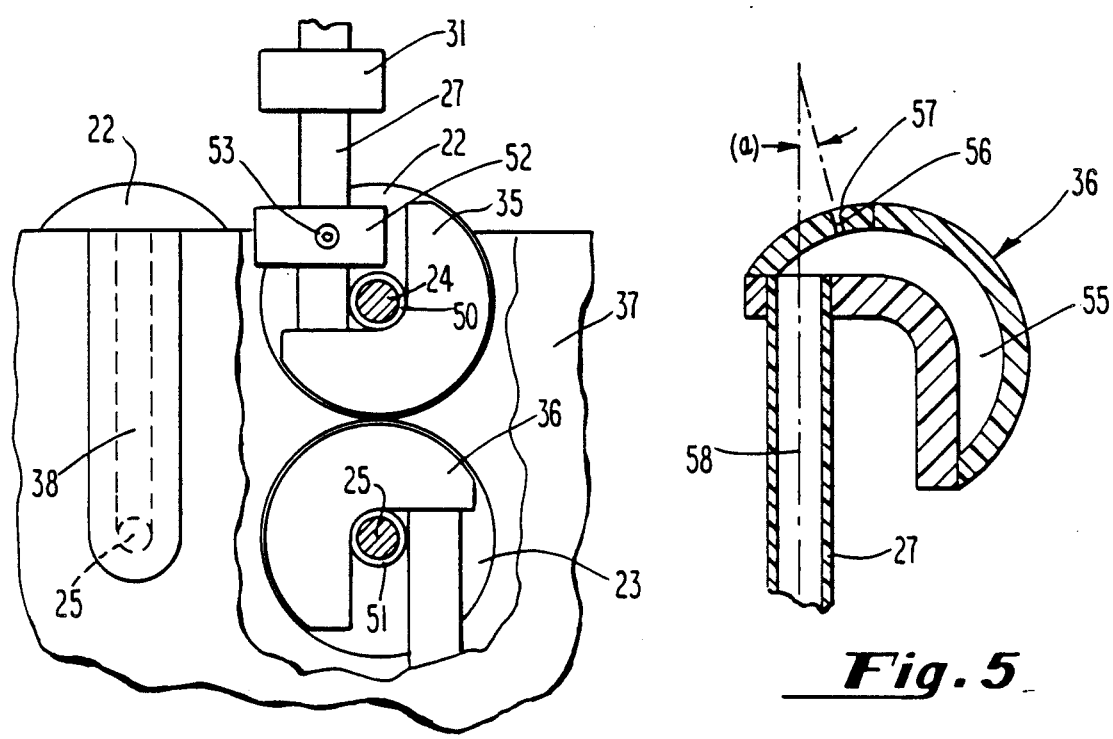
Fig. 4
Fig. 5

PROCESS AND APPARATUS FOR FLIUD TREATMENT OF ARTICLES

BACKGROUND OF THE INVENTION

In the manufacture of many articles, including but not limited to printed circuit boards and like goods, and in processes connected with the same, it has become commonplace to deliver the articles, such as printed circuit boards, printed circuit film or the like, through a chamber in a continuous manner, while the articles are being treated by the spray of a suitable treatment fluid, such as an etchant, onto them. Often the etchant is of a corrosive nature, but on other occasions it can be various chemical solutions or even ordinary rinsing liquid, such as water. See, for example, U.S. Pat. No. 4,233,106, the disclosure of which is herein incorporated by reference.

In other instances, vacuum can be drawn over articles, for removing moisture therefrom, for removing liquids from printed circuit through-holes, or for any other purposes where drawing a partial vacuum from the vicinity of the articles being treated, is desirable.

In the course of such treatments, it has become commonplace to utilize spray nozzles, such as are shown in U.S. Pat. Nos. 3,082,774, 3,776,800 and 3,905,827, flood bars, such as are shown in U.S. Pat. No. 4,576,685, air blowers, such as are shown in U.S. Pat. Nos. 4,017,982 and 3,801,387 vacuum draw devices and many other devices for applying to, or removing from articles, a desired etchant, alkaline, rinse, air, vacuum, etc., with the disclosures of all of those U.S. patents being herein incorporated by reference.

The present invention is directed to providing an improvement in the treatment of articles where fluid treatment takes place.

SUMMARY OF THE INVENTION

The present invention is directed toward providing individual nozzles mounted not to rotate, between driven disks, on the drive rods that drive the disks, that, in turn, determine the path of travel of articles through a treatment zone in which they are treated by a treatment fluid with the nozzles being capable of moving toward and away from the path of travel articles through the apparatus, and with the nozzles being connected to a fluid supply or withdrawal source. The present invention is also directed to a process and apparatus for using the same to treat articles with a treatment fluid.

Accordingly, it is a primary object of this invention to provide a novel method and apparatus for treating articles as they are conveyed along a predetermined path through an apparatus, by means of individual nozzles carried by drive shafts that rotate disk-like elements, that, in turn, determine the path of travel of articles.

It is a further object of this invention to accomplish the above object by allowing for movement of the nozzles with the drive rods on which they are mounted, toward and away from the path of travel of articles through the treatment zone.

It is a further object of this invention to accomplish the above objects, wherein the nozzles may be arranged in a field through which articles may pass.

It is yet another object of the present invention to accomplish the above objects, wherein the nozzles are configured to have a generally cylindrical component, the diameter of which is less than the diameter of the article-conveyer disks that are carried by the rods.

It is yet another object of this invention to accomplish the above objects, wherein the treatment fluid may be delivered to, or withdrawn from, the zone of article treatment.

Other objects and advantages of the present invention will be readily apparent to those skilled in the art, from a reading of the following brief descriptions of the drawing figures, detailed description of the preferred embodiment, and the appended claims.

BRIEF DESCRIPTION OF THE DRAWING FIGURES

FIG. 3 is a fragmentary top plan view of a portion of the apparatus illustrated in FIG. 2, taken generally along the line III—III of FIG. 2.

FIG. 4 is a fragmentary vertical elevational view of a portion of the apparatus of this invention, taken generally along the line IV—IV of FIG. 3, and wherein the mounting of opposed upper and lower nozzles on corresponding upper and lower drive rods, in accordance with this invention, is more clearly illustrated.

FIG. 5 is an enlarged, vertical sectional view, of one of the lower nozzles illustrated in FIG. 2, taken generally along the line V—V of FIG. 2.

DETAILED DESCRIPTION OF THE PREFERRED EMBODIMENT

Figure 1:
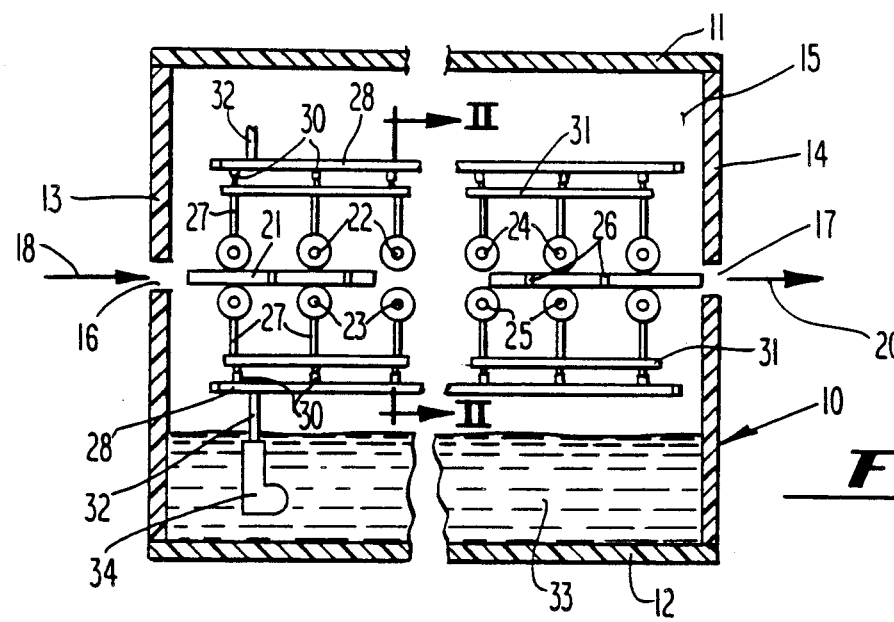
FIG. 1 is a schematic, fragmentary, vertical sectional view, taken through an apparatus in accordance with this invention, wherein articles pass from left to right through the apparatus and are subjected to treatment fluid therein.

Referring now to the drawings in detail, reference is first made to FIG. 1, wherein there is illustrated a fluid treatment apparatus or chamber in accordance with this invention, generally designated by the numeral 10, as including a chamber having upper and lower walls 11 and 12, respectively, left and right walls 13 and 14, and opposed side walls 15, generally defining the apparatus. There is an inlet 16 at the left end of the apparatus 10, and an outlet 17, as shown, whereby articles may pass through the apparatus 10 between the inlet and outlet thereof, along a path of travel in the direction of the arrows 18 and 20.

In a path of travel through the apparatus 10, the articles 21 pass between upper and lower rotating drive disks 22 and 23, respectively, which in turn are mounted on and driven by upper and lower drive rods 24 and 25, respectively. The drive rods 24 and 25 are driven from one end of the apparatus by means of a drive mechanism similar to that set forth in U.S. Pat. No. 4,015,706, the disclosure of which is herein incorporated by reference.

It will be understood that the articles being treated may be treated with an etchant, alkaline, a water or other rinse, or any other treatment, such as by electroless, electrolytic or other treatment by chemicals or the like, or such articles 21 may be treated by blowing air or other gases at them, or by the drawing of gas, air, or the like through the articles, such as, for example, by drawing, by means of a partial vacuum, air through through-holes 26, or the like, in instances in which the articles 21 are printed circuit boards of a multilayer, or other type, having such through-holes 26 therein. Additionally there can be combinations of liquid and gaseous treatment. Similarly, gases, moisture, and the like may be drawn off in accordance with this invention as will be more clearly understood hereinafter. Furthermore, while in the apparatus 10 as shown in FIG. 1, the articles 21 are moved generally horizontally through the apparatus, along a horizontal path of travel, it will be understood that the orientation of the path of travel may take many forms, as may take the orientation of the articles themselves, whether moving in a horizontal path or not. Accordingly, the path of travel of articles could be vertical while moving horizontally, or vertical while moving vertical, or any other orientation, etc., as e.g., through a dip tank or the like. Additionally, the nozzles could be used to apply metallic substances to articles by electrically connecting the nozzles and articles being treated as anodes and cathodes respectively, or the converse, in which case the treatment fluid would be an electrolyte liquid. In this regard, reference is made to U.S. Pat. No. 4,402,799, the complete disclosure of which is herein incorporated by reference.

In a particular embodiment illustrated in FIG. 1, between adjacent disk-like members 22, there are provided nozzles, (not shown), which are fed via supply lines or tubes 27, that, in turn, are fed from a fluid handling conduit, 28, preferably extending through the apparatus in the direction of the path of travel of articles 21 therethrough, and preferably with flexible fluid-handling connections 30 between conduits 28 and fluid supply lines 27. Preferably, the fluid supply lines 27 are held in place by retaining strips 31, that are carried from suitable fixedly positioned side rails (not shown), or side walls 15, or the like.

The conduits 28 are supplied with, or have withdrawn therefrom, fluid, via supply or withdrawal lines 32, which in turn are either supplied with fluid 33, or withdraw air or other fluid via some means for effecting a relative pressure differential, such as a pump 34. In the embodiment shown in FIG. 1, the pump 34 will normally pump a liquid 33 from the bottom of the chamber 10, via supply lines and conduits, for delivery through nozzles, although in the alternative, the device 34 could function as a vacuum pump, drawing air or other fluids from nozzles into the bottom of the apparatus 10, or outwardly of the apparatus to discharge (not shown).

Figure 2:
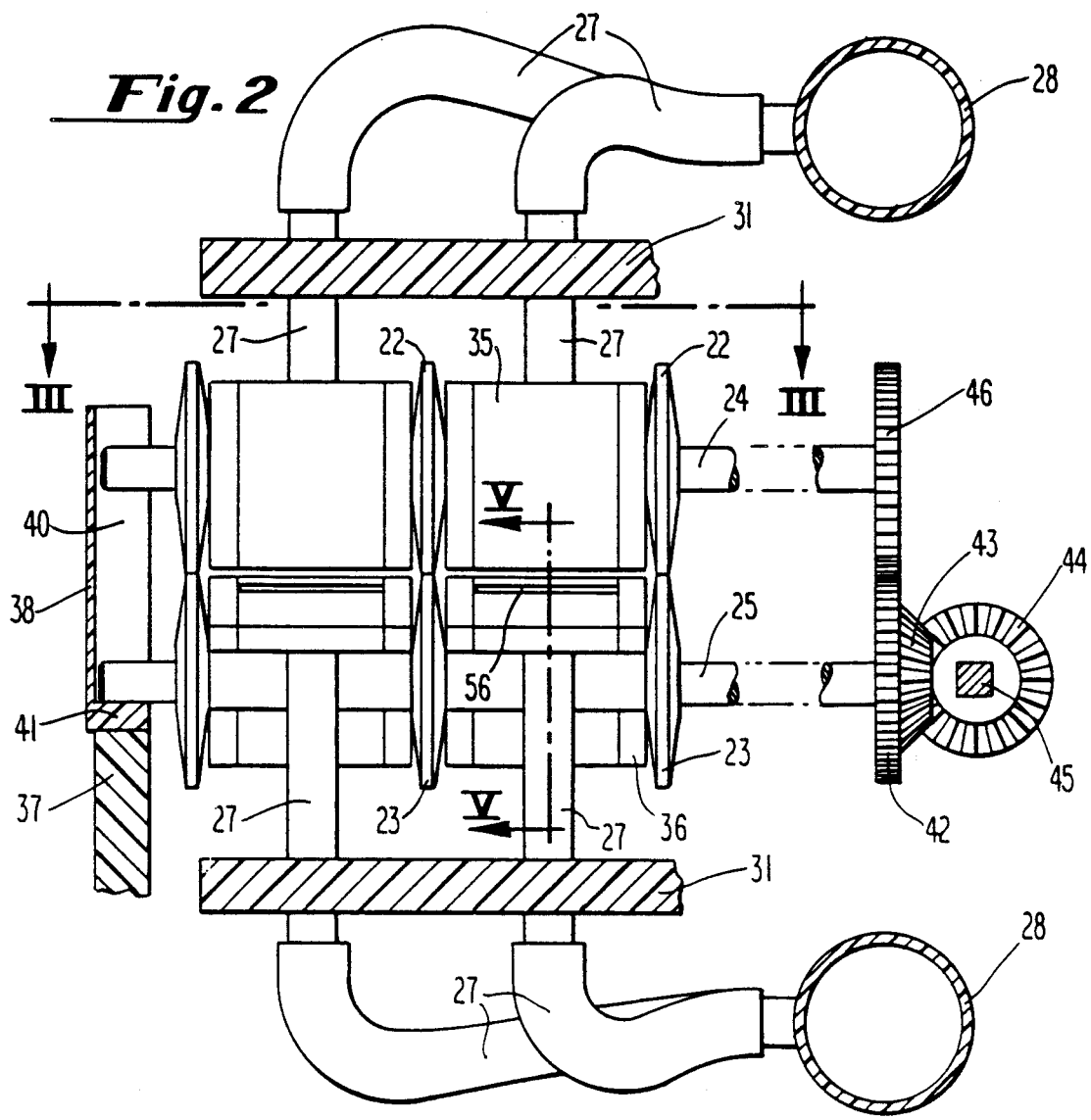
FIG. 2 is an enlarged fragmentary vertical sectional view of the apparatus of this invention, taken generally along the line II—II of FIG. 1, wherein upper and lower drive rods for disk-like members, having separate nozzles carried between adjacent disks, are illustrated, as is the drive for the drive rods, at the right end thereof.

With reference now to FIG. 2, it will be seen that upper and lower nozzles 35 and 36 are respectively mounted on upper and lower rotatably driven rods 24 and 25, to be carried by the rods for movement therewith toward and away from the path of travel of articles through the apparatus, but not for rotation therewith, with the nozzles 35 and 36 being mounted between, and substantially filling the space between adjacent upper and lower drive disk-like members 22, and 23, respectively, as shown.

The left end of FIG. 2 illustrates a side rail 37 having an insert 38 therein, with a vertical slot 40 in the insert, for receipt of the left-most end of drive rod 25 therein, as shown, mounted on a suitable bearing or the like 41, as desired. The right end of rod 25 extends through another side rail (not shown), and is provided with a drive gear 42 of the spur gear type, having a bevel gear 43 carried for rotation therewith, which, in turn is driven by a bevel gear 44 carried on a main drive shaft 45, as shown. The spur gear 42 is in mesh with an upper spur gear 46, that drives the drive rod 24. Consequently, upon rotation of the main drive shaft 45, the drive rods 24 and 25 will rotate in opposite directions, for conveying an article 21 through the apparatus, such as from left to right as shown in FIG. 1. It will also be noted that the lower disk-like drive members 23 may, if desired, support upper disk members 22, and consequently the drive rod 24, and that the left end of the drive 24 as illustrated in FIG. 2, being disposed in vertical slotted zone 40, is free to ride upwardly therein, to accommodate the passage of an article between opposed rotating disk-like members that provide the drive for articles through the apparatus 10. In situations of use of thicker articles through the apparatus 10, some means may be provided for allowing upward movement of the right-most end of upper drive rods, such as by using a flexible portion at the very end of the drive rod 24, sufficiently deep teeth on the spur gears 42 and 46 to allow for enough vertical "play" allow for relative movement between upper and lower drive rods 24, 25, or any other means of effecting a drive for one or more of the drive rods 24 and 25 that will allow sufficient movement therebetween to accomplish their purpose of facilitating the travel of articles through the apparatus 10 of this invention.

With particular reference now to FIG. 4, it will be seen that the upper and lower nozzles 35, 36 are mounted on respective bushings 50 and 51, for facilitating rotation of respective drive rods 24 and 25 within the bushings, and with appropriate clamping means such as an adjustably mounted collar 52, shown for suitable tightening against the outside of upper supply line 27, by means of a set screw 53 or the like in collar 52, whereby the nozzle 22 may be effectively clamped to the supply line 27, which, in turn, is carried by the retaining support or strip 31. A similar clamping is provided for the nozzle 36, such as will facilitate adjustment, and/or application or removal of the nozzles, as are desired.

It will be seen, particularly with reference to FIG. 3, that a "field" of nozzles may be arranged, with nozzles disposed between disks on a given rod, on some rods and not others, or on all rods, as are desired, and that the placement of disks 22 on rods 24 may be staggered as shown, if desired. In cases where nozzles are applied to a number of drive rods along an apparatus, in a "field" as shown, it is preferable to stagger the disks 23 as shown, to compensate for application of fluid, or withdrawal of air or other fluid in those locations where fluid treatment is not possible, such as, at the very ends of the nozzles, or between adjacent nozzles where disks are situated, not allowing for fluid treatment. It is thus seen that by a staggered arrangement such as shown in FIG. 3, fluid treatment may take place completely across the apparatus, although perhaps at different locations along the path of flow of apparatus, such that, as a given printed circuit board, for example, is being treated, there will be some location across the apparatus where such treatment will be applicable, leaving no untreated spaces for the printed circuit board.

With respect to FIG. 5, it will be seen that the nozzle 36 is generally constructed, in the transverse section illustrated in FIG. 5, as a segment of a circle, having a substantially hollow interior 55, such that when fluid is delivered via line 27, the same will enter the interior zone 55, for eventual spraying or flooding outwardly of slot 56, in the case of fluid application, or in the case of vacuum withdrawal by means of induced pressure, vacuum, or the like into slot 56, into zone 55, and outwardly through conduit 27. It will be noted that the slot 56 extends substantially completely between opposed disks 23, and has a chamfered outer portion 57. The slot 56 is preferably cut at an angle of about 15° at angle "(a)" from center line 58, as shown.

It will been seen from the foregoing that various modifications may be made in the details of construction, as well as in the use and operation of the apparatus of this invention, all within the scope of the appended claims. For example, it will be apparent that the present invention is independent of panel length or width, that the nozzles being mounted on the rods, as such, are independent of the material thickness of the articles being treated, and allow a constant distance between the nozzle openings and the material being treated. Furthermore, the present arrangement for nozzles in accordance with this invention allows the nozzles to be used on either side of the path of travel, with nozzles generally being interchangeable therewith. Furthermore, while the present invention is adaptable to the treatment of reasonably thick articles, it is also adaptable for the treatment of thin material, such as printed circuit film or the like as mentioned herein above. In such instances where thin material is being handled, the nozzles may or may not be used in conjunction with material guides of the type set forth in U.S. Pat. No. 4,781,205, the complete disclosure of which is also herein incorporated by reference. It will further be apparent that materials of construction will be selected in accordance with the desired use and with the particular fluid that comprises the treatment fluid intended for use with articles being treated.

What is claimed is:

1. A process for the treatment of articles with fluid as the articles are being delivered along a predetermined path, comprising the steps of:
   (a) delivering the articles along a path of travel in a fluid treatment zone by:
      (i) providing a plurality of driven rods generally extending transverse to the path of travel of articles and rotatably driving the rods in a rotating direction for driving disk-like members that are in spaced-apart relation on the rods;
      (ii) engaging the articles with the rotating disk-like members along the path of article travel, to drive the articles along their path of travel;
   (b) subjecting the articles to a fluid as they are delivered along their path of travel by:
      (i) providing a plurality of fluid-handling nozzles with hollow interior portions and having fluid-accommodating openings;
      (ii) carrying the nozzles in non-rotational mounted relation on at least one rotatably driven rod, extending along the rod between adjacent disk-like members on the rod, with the nozzle openings facing generally toward the path of travel; and
      (iii) applying a relative fluid pressure between the hollow interior portions of the nozzles and an adjacent zone exterior thereof along the path of travel, and thereby causing fluid to pass through nozzle openings as articles pass across the openings as they travel along their path of travel.

2. The method of claim 1, wherein the nozzles are provided to extend substantially completely between two adjacent spaced-apart disk-like members on a rod.

3. The method of claim 1, and moving at least one rod generally transverse of the path of travel of articles while likewise moving nozzles that are carried by the rod, for transverse movement therewith.

4. The method of claim 3, wherein a fluid-handling, at least partially flexible, line is provided connected to the nozzles and connected to a fluid-handling conduit, and including the step of flexing the flexible fluid-handling line as the rod is moved transverse of the path of travel.

5. The method claim 4, wherein the fluid-handling line is disposed away from, but generally parallel to, the path of travel of articles, and including the step of delivering fluid through the fluid-handling line in a direction generally parallel to the path of travel of articles.

6. The method of claim 1, wherein the articles that are being treated are printed circuit boards having through-holes therein and wherein the fluid treatment of the articles from the nozzles includes causing fluid to pass through the through-holes of the printed circuit boards.

7. The method of claim 1, wherein the path of travel of articles is generally horizontal.

8. The method of claim 7, and moving at least one rod generally vertically, transverse of the path of travel of articles, while likewise moving nozzles that are carried by the rod, for generally vertical movement therewith.

9. The method of any one of claims 1 through 8, wherein the treatment fluid is a liquid that is supplied to the nozzles and is delivered therefrom, in application to the articles.

10. The method of any one of claims 1 through 8, wherein the treatment fluid is a gas that is supplied to the nozzles and is delivered therefrom, in application to the articles.

11. The method of any one of claims 1 through 8, wherein the treatment fluid is a liquid that is drawn into the nozzles from the articles being treated.

12. The method of any one of claims 1 through 8, wherein the treatment fluid is a gas that is drawn into the nozzles from the articles being treated.

13. The method of claim 2, and moving at least one rod generally transverse of the path of travel of articles while likewise moving nozzles that are carried by the rod, for transverse movement therewith, wherein a fluid-handling, at least partially flexible, line is provided connected to the nozzles and connected to a fluid handling conduit, and including the step of flexing the flexible fluid-handling line as the rod is moved transverse of the path of travel, wherein the fluid-handling line is disposed away from, but generally parallel to, the path of travel of articles, and including the step of delivering fluid through the fluid-handling line in a direction generally parallel to the path of travel of articles, wherein the articles that are being treated are printed circuit boards having through-holes therein and wherein the fluid treatment of the articles from the nozzles includes causing fluid to pass through the through-holes of the printed circuit boards.

14. The method of claim 13, wherein the path of travel is generally horizontal, and with the movement of the rod being generally vertical.

15. An apparatus for treating articles with fluid as the articles are being delivered along a predetermined path, comprising:
   (a) means defining a fluid treatment zone and means for defining a path of travel of articles and for delivering the articles along the path of travel in the fluid treatment zone including:

(i) a plurality of driven rods generally extending transverse to the path of travel of articles, a plurality of disk-like members mounted in spaced-apart relation on the rods, and means for rotatably driving the rods in a rotating direction for rotatably driving the disk-like members;

(ii) said disk-like members comprising means engaging the articles along the path of article travel, to drive the articles along their path of travel;

(b) means for subjecting the articles to a fluid as they are delivered along their path of travel, including:

(i) a plurality of fluid-handling nozzles with hollow interior portions and having fluid-accommodating openings;

(ii) with the nozzles being in non-rotational mounted relation on at least one rotatably drivable rod, disposed along the rod between adjacent disk-like members on the rod, with the nozzle openings facing generally toward the path of travel; and (iii) means applying a relative fluid pressure between the hollow interior portions of the nozzles and an adjacent zone exterior thereof along the path of travel, and thereby causing fluid to pass through nozzle openings as articles pass across the openings as they travel along their path of travel.

16. The apparatus of claim 15, wherein the nozzles are disposed substantially completely between two adjacent spaced-apart disk-like members on a rod.

17. The apparatus of claim 15, and means facilitating movement for at least one rod generally transverse of the path of travel of articles for likewise facilitating movement of nozzles that are carried by the rod, for transverse movement therewith.

18. The apparatus of claim 17, wherein a fluid-handling, at least partially flexible, line is provided connected to the nozzles and connected to a fluid-handling conduit.

19. The apparatus of claim 18, wherein the fluid-handling line is disposed away from, but generally parallel to, the path of travel of articles, and comprises means facilitating the delivery of fluid through the fluid-handling line in a direction generally parallel to the path of travel of articles.

20. The apparatus of claim 15, wherein the articles that are being treated are printed circuit boards having through-holes therein and wherein the nozzles comprise means for fluid treatment of the articles by causing fluid to pass through the through-holes of the printed circuit boards.

21. The apparatus of claim 15, wherein the path of travel of articles is generally horizontal.

22. The apparatus of claim 21, and means facilitating movement of at least one rod generally vertically, transverse of the path of travel of articles, for likewise facilitating movement of nozzles that are carried by the rod, for generally vertical movement therewith.

23. The apparatus of any one of claims 15 through 22, wherein the means for subjecting articles to a treatment fluid includes means for delivering a liquid that is supplied to the nozzles for application to the articles.

24. The apparatus of any one of claims 15 through 22, wherein means for subjecting articles to a treatment fluid includes means for delivering a gas that is supplied to the nozzles for application to the articles.

25. The apparatus of any one of claims 15 through 22, wherein the means for subjecting articles to a treatment fluid includes means for drawing a liquid into the nozzles from near the articles being treated.

26. The apparatus of any one of claims 15 through 22, wherein the means for subjecting articles to a treatment fluid includes means for drawing a gas into the nozzles from near the articles being treated.

27. The apparatus of claim 16, and means facilitating movement of at least one rod generally transverse of the path of travel of articles for likewise facilitating movement of nozzles that are carried by the rod, for transverse movement therewith, wherein a fluid-handling, at least partially flexible, line is provided connected to the nozzles and connected to a fluid handling conduit, wherein the fluid-handling line is disposed away from, but generally parallel to, the path of travel of articles, and comprising means facilitating delivery of fluid through the fluid-handling line in a direction generally parallel to the path of travel of articles, wherein the articles that are being treated are printed circuit boards having through-holes therein and wherein the nozzles comprise means for fluid treatment of the articles by causing fluid to pass through the through-holes of the printed circuit boards.

28. The apparatus of claim 27, wherein the path of travel of articles is generally horizontal, and with the movement of the rod being generally vertical.

29. The apparatus of claim 15, wherein the nozzles comprises generally cylindrical segments of a diameter less than that of an adjacent associated said disk-like member.

30. The apparatus of claim 29, wherein the nozzle openings extend transversely of the path of travel of articles and substantially the length of the nozzle between adjacent disk-like members.

31. The apparatus of claim 15, including means detachably positioning the nozzles on the rod.

32. The apparatus of claim 3, wherein the nozzles comprises generally cylindrical segments of a diameter less than that of an adjacent associated said disk-like member, wherein the nozzle openings extend transversely of the path of travel of articles and substantially the length of the nozzle between adjacent disk-like members.

* * * * *